(12) United States Patent
Sugahara et al.

(10) Patent No.: US 9,082,736 B2
(45) Date of Patent: Jul. 14, 2015

(54) ORGANIC EL PANEL AND METHOD OF MANUFACTURING THE SAME

(75) Inventors: Jun Sugahara, Yamagata-ken (JP); Masami Kimura, Yamagata-ken (JP)

(73) Assignees: Pioneer Corporation, Kanagawa (JP); Tohoku Pioneer Corporation, Yamagata (JP)

(*) Notice: Subject to any disclaimer, the term of this patent is extended or adjusted under 35 U.S.C. 154(b) by 0 days.

(21) Appl. No.: 13/581,569

(22) PCT Filed: Mar. 5, 2010

(86) PCT No.: PCT/JP2010/053660
§ 371 (c)(1),
(2), (4) Date: Aug. 28, 2012

(87) PCT Pub. No.: WO2011/108113
PCT Pub. Date: Sep. 9, 2011

(65) Prior Publication Data
US 2012/0319570 A1    Dec. 20, 2012

(51) Int. Cl.
*H01J 1/62* (2006.01)
*H01J 63/04* (2006.01)
(Continued)

(52) U.S. Cl.
CPC ............ *H01L 27/3288* (2013.01); *H05B 33/10* (2013.01); *H01L 27/329* (2013.01); *H01L 2251/566* (2013.01)

(58) Field of Classification Search
CPC ............ H01L 51/5206; H01L 51/5221; H01L 27/3276; H01L 51/5203; H01L 27/3288; H01L 27/3283; H01L 51/56; H01L 27/3246; B60Q 3/0283; H05B 33/10

USPC ........................ 313/498–512; 445/23–25, 46
See application file for complete search history.

(56) References Cited

U.S. PATENT DOCUMENTS

2004/0207316 A1* 10/2004 Birnstock et al. ............. 313/504
2005/0017628 A1*  1/2005 Prakash ........................ 313/504
(Continued)

FOREIGN PATENT DOCUMENTS

| JP | 5-188362 A | 7/1993 |
| JP | 08-185978 A | 7/1996 |
| JP | 2001-230073 A | 8/2001 |

(Continued)

OTHER PUBLICATIONS

International Search Report w/translation from PCT/JP2010/053660 mailed on Jun. 8, 2010 (4 pages).
(Continued)

*Primary Examiner* — Thomas A Hollweg
*Assistant Examiner* — Kevin Quarterman
(74) *Attorney, Agent, or Firm* — Osha Liang LLP

(57) ABSTRACT

An organic EL panel forms at least one organic EL element on a substrate. The organic EL element has a laminating structure in which an organic layer including a light-emitting layer is arranged between an anode and a cathode. A light-emitting region in which the organic EL element is formed and a wiring region in which a wiring electrode is formed are formed on the substrate, the wiring electrode is drawn out from the light-emitting region and is electrically connected to the anode or the cathode of the organic EL element, and the wiring electrode has a planarly R shaped portion having a rounded corner at the end part on the side of the organic EL element.

13 Claims, 6 Drawing Sheets

(51) Int. Cl.
*H01L 27/32* (2006.01)
*H05B 33/10* (2006.01)

(56) References Cited

U.S. PATENT DOCUMENTS

2007/0040493 A1* 2/2007 Sellars et al. ............. 313/504
2007/0257602 A1* 11/2007 Miyagi et al. ............. 313/503

FOREIGN PATENT DOCUMENTS

| JP | 2001230073 A | * | 8/2001 | ............ | H05B 33/06 |
|---|---|---|---|---|---|
| JP | 2002-14370 A | | 1/2002 | | |
| JP | 2002-189225 A | | 7/2002 | | |
| JP | 2003-36037 A | | 2/2003 | | |
| JP | 2005-100904 A | | 4/2005 | | |
| JP | 2005-183209 A | | 7/2005 | | |
| JP | 2006-19266 A | | 1/2006 | | |
| JP | 2009-301032 A | | 12/2009 | | |

OTHER PUBLICATIONS

Patent Abstracts of Japan, Publication No. 2003-036037 dated Feb. 7, 2003 (1 page).

Japanese Office Action issued in Japanese Patent Application No. 2012-502948, mailing date Jan. 21, 2014 (4 pages).

* cited by examiner

ORGANIC EL PANEL AND METHOD OF MANUFACTURING THE SAME

FIELD OF THE INVENTION

The present invention relates to an organic EL panel and a method of manufacturing the same.

BACKGROUND OF THE INVENTION

An organic EL panel is a self-emission panel in which a single or a plurality of organic EL elements is arranged on a substrate, and is used for various purposes, such as a display and an illumination. An organic EL element has a laminating structure which includes a lower electrode, an organic layer having a light-emitting layer and an upper electrode sequentially laminated from the substrate side, and either one of the lower electrode and the upper electrode functions as an anode while the other one functions as a cathode. A hole injected and transported from the anode and an electron injected and transported from the cathode are recombined in the light-emitting layer, whereby light is emitted. As such, the brightness of an organic EL element is dependent on the magnitude of the current flowing between the anode and the cathode, and the light emitting efficiency of an element is significantly affected by the electrical resistance of a wiring electrode which supplies electricity to the element.

If the electrical resistance of a wiring electrode is high, since the length of the wiring electrode is varied depending on the position where an organic EL element is arranged on a substrate, there is a problem that brightness inconsistency occurs for respective elements due to a voltage drop caused by the current flowing through the wiring electrode. In order to address the problem, it is required to reduce the electrical resistance of the wiring electrode, and thus the wiring electrode is formed by laminating a conductive layer made of low electrical resistance metal or alloy such as Al and Ag on a metal oxide layer having high adhesion with respect to a glass substrate (see patent literature 1 which is shown below).

[Patent literature 1] Japanese laid-open patent publication 2003-36037

The wiring electrode formed on the substrate of an organic EL panel has a cathode wiring electrically connected to a cathode and an anode wiring electrically connected to an anode. These wiring electrodes are pattern-formed on the substrate along with a lower electrode that is a component of an organic EL element before an organic layer is film-formed, and thus the pattern of the wiring electrodes exists on the substrate as an independent pattern before the organic layer is film-formed. If the pattern of the wiring electrode independently existing on the substrate as described above is electrostatically charged, the charged static electricity flows into an element side when the organic layer is film-formed or after the laminating structure of the organic EL element has been formed, which may cause a problem of having an adverse effect on the organic layer and the element structure. Further, when the alignment of a metal mask, which is used for film-forming the organic layer, is performed, there is a problem that the electrostatically charged wiring electrode has an adverse effect on the alignment, thereby making it difficult to perform the alignment and so forth.

An object of the present invention is to address the problems as mentioned above. That is, one of the objects of the present invention is to prevent the static electricity which was charged on the wiring electrode formed on a substrate from having an adverse effect on the organic layer and the element structure of an organic EL element at the stage of manufacturing an organic EL panel.

SUMMARY OF THE INVENTION

In order to achieve such an object, an organic EL panel and a method of manufacturing the same according to the present invention are provided with at least the configuration according to the following respective independent claims.

An organic EL panel forming at least one organic EL element on a substrate, wherein the organic EL element has a laminating structure in which an organic layer including a light-emitting layer is arranged between an anode and a cathode, and a light-emitting region in which the organic EL element is formed and a wiring region in which a wiring electrode is formed are formed on the substrate, the wiring electrode is drawn out from the light-emitting region and is electrically connected to the anode or the cathode of the organic EL element, and the wiring electrode has a planarly R shaped portion having a rounded corner at the end part on the side of the organic EL element.

A method of manufacturing an organic EL panel forming at least one organic EL element on a substrate, the method including a step of forming, on a large substrate having a plurality of panel forming regions in which a plurality of organic EL panels is formed at the same time, a first wiring electrode electrically connected to one of the anode and cathode of the organic EL element across a plurality of the panel forming regions, a second wiring electrode which is formed in each of the panel forming regions and is electrically connected to the other one of the anode and cathode of the organic EL element, and a conducting pattern for emitting an electric charge, which is electrically connected to or in the proximity of the first and the second wiring electrodes, a step of forming an organic EL element in the panel forming regions, a step of forming a sealing region for sealing the organic EL element for the respective panel forming regions, a step of dividing the first wiring electrode within the sealing region for the respective panel forming regions, and a step of forming an individual organic EL panel by dividing the large substrate for the respective panel forming regions, wherein the second wiring electrode has an R shaped portion formed at the end part on the side of the organic EL element while the end part opposite the side of the organic EL element is electrically connected to or in the proximity of the conducting pattern.

BRIEF DESCRIPTION OF THE DRAWINGS

FIG. 1(a) is an overall plan view of the organic EL panel, FIG. 1(b) is a cross-sectional view taken along the line A-A, and FIG. 1(c) is an enlarged view of a section B;

FIGS. 2(a) and 2(b) are views illustrating embodiments of the present invention, and FIG. 2(c) is a view illustrating the prior art;

DETAILED DESCRIPTION OF THE INVENTION

Hereinafter, an embodiment of the present invention will be described with reference to the drawings. The embodiment of the present invention includes the illustrated contents but is not limited only to these contents. The same symbols are applied to common parts shown in the respective figures in the following descriptions, and thus duplicated descriptions are partially eliminated.

Figure 1:
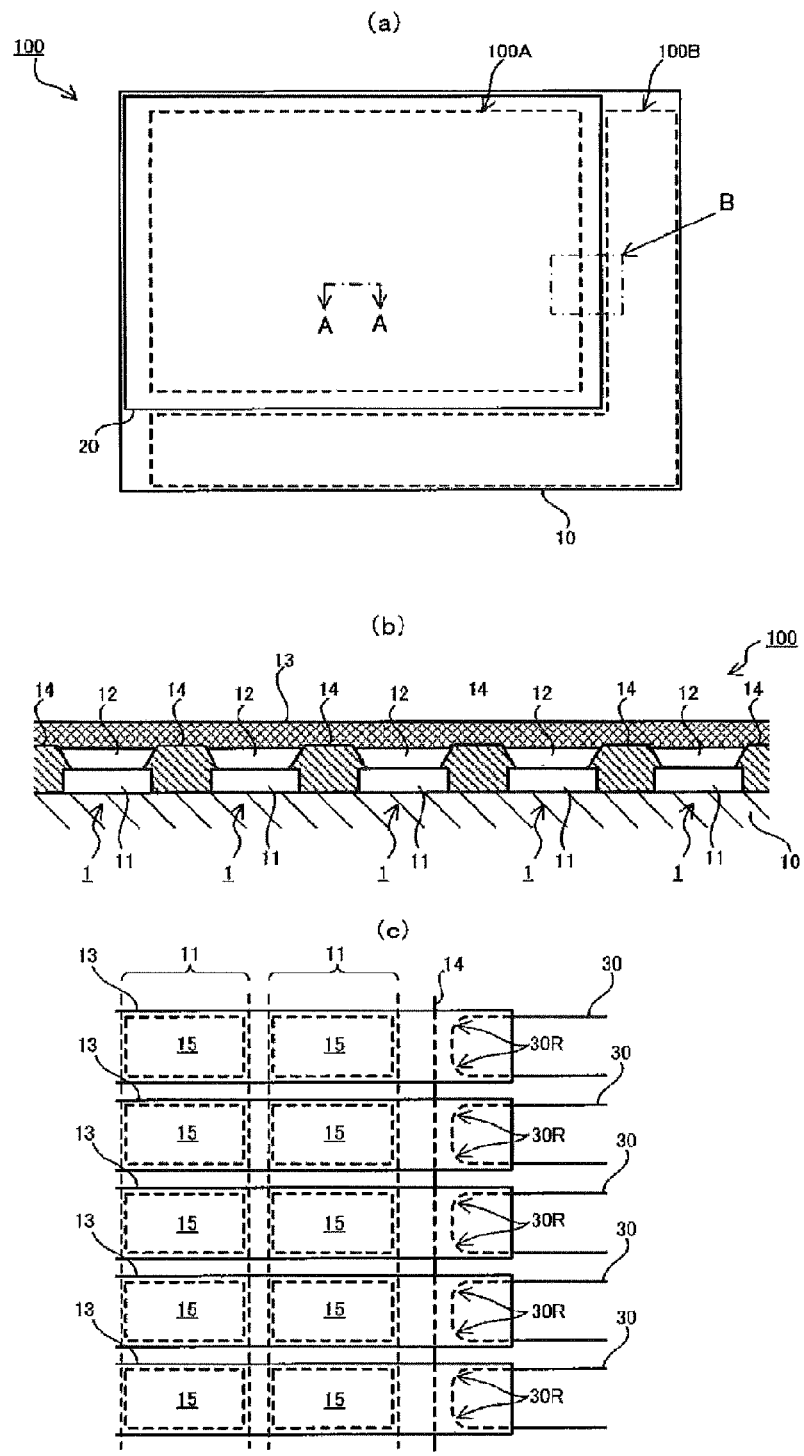
FIG. 1 is a view illustrating an organic EL panel according to an embodiment of the present invention.

FIG. 1 is a view illustrating an organic EL panel according to an embodiment of the present invention. FIG. 1(a) is an overall plan view of the organic EL panel, FIG. 1(b) is a cross-sectional view taken along the line A-A, and FIG. 1(c) is an enlarged view of a section B. An organic EL panel 100 has at least a single organic EL element 1 formed on a substrate 10. The organic EL element 1 is formed by laminating a lower electrode 11, an organic layer 12 having a light-emitting layer, and an upper electrode 13 sequentially from the side of the substrate 10. Either the lower electrode 11 or the upper electrode 13 is defined as a cathode, and the other is defined as an anode. The organic EL element 1 has a laminating structure, having an organic layer 12 arranged between the cathode and the anode.

In an example shown in the drawing, although the lower electrode 11, the organic layer 12 and the upper electrode 13 are directly laminated on the substrate 10, another layer may be interposed between respective layers for a functional purpose or a control of film thickness and so forth. When the substrate 10 has a light transmissive property, the lower electrode 11 has a light transmissive property and the upper electrode 13 has a light reflective property, a system of emitting light from the side of the substrate 10 (bottom emission system) is adopted, and when the upper electrode 13 has a light transmissive property and the lower electrode has a light reflective property, a system of emitting light from the side of the upper electrode 13 (top emission system) is adopted. Both the lower electrode 11 and the upper electrode 13 may have the light transmissive properties, and thus a system of emitting light from both sides (dual emission system) may be adopted.

Due to a voltage applied between the lower electrode 11 and the upper electrode 13 in the organic EL element 1, a positive hole is injected and transported from the anode side to the organic layer 12 and an electron is injected and transported from the cathode side to the organic layer 12, and the positive hole and the electron are recombined in the light-emitting layer, whereby light is emitted. As such, the brightness is dependent on the magnitude of the current flowing between the anode and the cathode.

The organic EL panel 100 including a plurality of the organic EL element 1 includes an insulating film 14 as shown in FIG. 1(b) in order to ensure the electric insulating properties between pluralities of the lower electrodes 11. As an example, the lower electrode 11 is pattern-formed in striped shape, and includes an insulating film 14 which demarcates a light-emitting part 15 on the lower electrode 11.

The organic EL panel 100 has a sealing structure wherein a sealing substrate 20 is joined to a substrate 10 as shown in FIG. 1(a). Further, the organic EL panel 100 includes a light-emitting region 100A wherein the organic EL element 1 is formed on the substrate 10 and a wiring region 100B wherein a wiring electrode 30 is formed, electrically connected to the anode or the cathode of the organic EL element 1. The light-emitting region 100A is formed within a sealing region covered with the sealing substrate 20 and the wiring region 100B is formed outside the light-emitting region 100A. Wiring electrodes 30 within the wiring region 100B are divided into those electrically connected to the lower electrode 11 and those electrically connected to the upper electrode 13. The wiring electrode 30 electrically connected to the lower electrode 11 can be continually formed along with the lower electrode 11. As for the wiring electrode 30 electrically connected to the upper electrode 13, the wiring electrode 30 formed on the substrate 10 and the upper electrode 13 are connected to each other during or after the formation of the upper electrode 13.

In such an organic EL panel 100, the wiring electrode 30 has a planarly R shaped portion 30R having rounded corners at the end part on the side of the organic EL element 1 (see FIG. 1(c)). The peripheral edge of the R shaped portion 30R is formed in an arc-like shape in the example shown in the drawing, but it is not limited to the arc-like shape. The peripheral edge of the R shaped portion 30R may be formed in any shaped curve by combining a plurality of curvatures. By providing such a R shaped portion 30R, electric charges are not concentrated in the end part of the wiring electrode 30 on the side of the organic EL element 1 even when static electricity is charged in the wiring electrode 30, and thus the electric charge can be prevented from flowing into the organic EL element 1 from the end part of the wiring electrode 30 on the side of the organic EL element 1. Although a significant effect can be produced by providing the R shaped portion 30R for all the end parts of the wiring electrode 30, it is possible to produce a desired effect by providing the R shaped portion 30R for a part of the end parts of the wiring electrode 30. The wiring electrode 30 provided with the R shaped portion 30R is not limited to either the anode wiring or the cathode wiring, that is, the R shaped portion 30R can be provided for either one or both of the anode wiring or the cathode wiring.

The charging of static electricity in the wiring electrode 30 can occur at any stage including stages after the wiring electrode 30 was formed on the substrate 10, before and after the organic layer 12 was film-formed, and before and after the sealing region was formed and so on. Further, in some cases the removal of static electricity (removal of electricity) from the wiring electrode 30 cannot be efficiently performed at each stage. Meanwhile by providing the R shaped portion 30R for the end part of the wiring electrode 30 on the side of the organic EL element 1, even when the wiring electrode 30 is charged, it becomes possible to minimize the adverse effect of static electricity applied to the organic layer 12 or the organic EL element 1.

Figure 2:
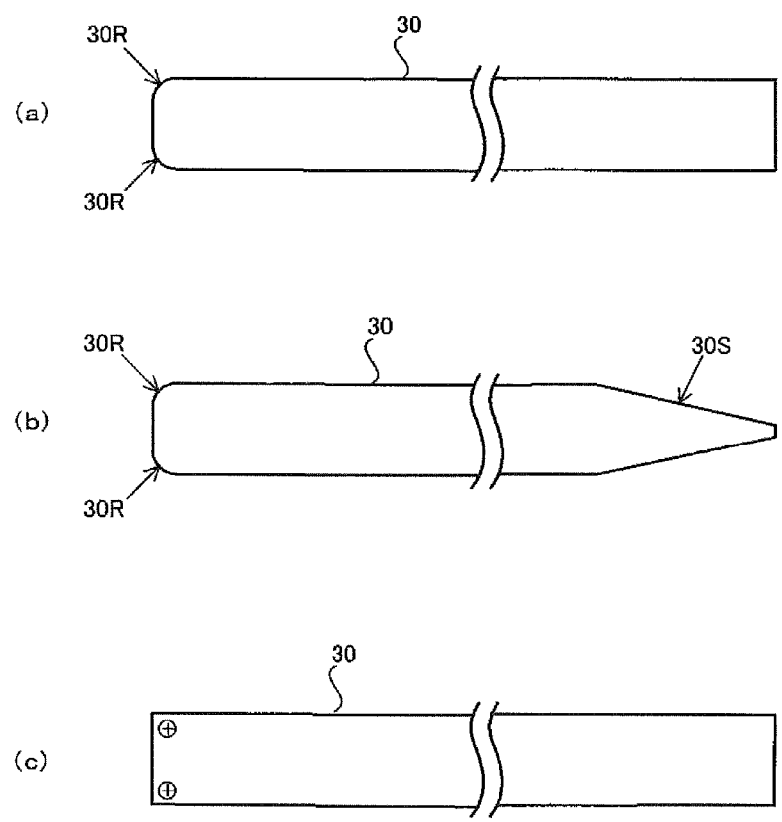
FIG. 2 is a view illustrating examples of a wiring electrode used for the organic EL panel according to an embodiment of the present invention and a prior art.

FIG. 2 is a view illustrating examples of the wiring electrode 30 used for the organic EL panel 100 according to an embodiment of the present invention and a prior art. FIG. 2(a) is a view illustrating an embodiment shown in FIG. 1(c) which is described above, wherein the end part on the side of the organic EL element 1 (light-emitting region side) is provided with the R shaped portion 30R. Since the R shaped portion 30R is provided for the purpose of preventing electric charges from concentrating in the end part, the R shaped portions 30R are preferably provided on both right and left sides. In the example shown in the drawing, although the R shaped portion 30R is symmetrically formed, the R shaped portion 30R may be formed not necessarily in a symmetrical shape.

An embodiment of the wiring electrode 30 as shown in FIG. 2(b) is provided with the R shaped portion 30R at the end part on the side of the organic EL element 1 (light-emitting region side), which is the same as the R shaped portion 30R shown in FIG. 2(a), and an electric charge emission portion 30S is provided at the end part opposite the side of the organic EL element 1 (substrate end edge side). The electric charge emission portion 30S has a function of emitting the electric charges that were charged in the wiring electrode 30 to the outside from the wiring electrode 30. By providing the electric charge emission portion 30S at the end part opposite the end part where the R shaped portion 30R is formed, it is possible to control the flow of the electric charge directed on the side of the organic EL element 1, whereby the phenomenon that electric charges are concentrated in the end part on the side of the organic EL element 1 can be more securely suppressed.

One configuration of the electric charge emission portion 30S is formed such that the end part of the wiring electrode 30 is planarly formed in a sharp shape directed on the side of the end edge of the substrate 10 as shown in FIG. 2(b). As such, since the electric charges that were charged in the wiring electrode 30 are more likely to be concentrated in the sharp shaped tip of the end part, the concentration of the electric charges in the opposite end part can be suppressed. FIG. 2(c) shows an example where the R shaped portion 30R and the electric charge emission portion 30S are not provided at the end part of the wiring electrode 30. In this case, when static electricity is charged in the wiring electrode 30, the electric charges are more likely to be concentrated at corners of the end part, and thus concern arises over the electric charges flowing into the organic EL element 1 therefrom.

Figure 3:
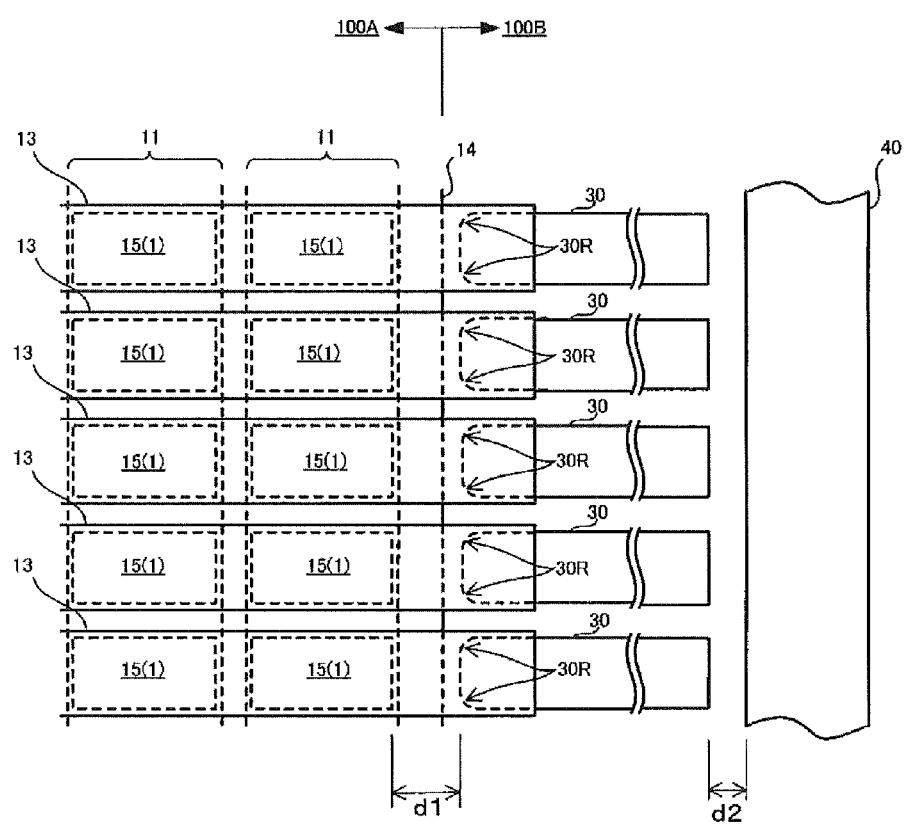
FIG. 3 is a view illustrating another example of an electric charge emission portion in the organic EL panel according to an embodiment of the present invention.

FIG. 3 is a view illustrating another example of the electric charge emission portion in the organic EL panel according to an embodiment of the present invention. Also in this example, the organic EL panel 100 is formed with the lower electrodes 11 which are arranged in striped shape and the upper electrodes 13 which are arranged in striped shape crossing the lower electrodes 11. The organic EL elements 1 having light-emitting parts 15 are formed at the crossing portions between the lower electrodes 11 and the upper electrodes 13. Further, the wiring electrodes 30 are formed on the substrate 10 in the wiring region 100B outside the light-emitting region 100A where the organic EL elements 1 are formed, and the end parts in which the R shaped portions 30R on the side of the organic EL elements 1 are formed are connected to the upper electrodes 13 and the end parts opposite thereto are formed directed to the end edge of the substrate 10.

Further, the electric charge emission portion is formed with a conducting pattern 40 which is formed near the end part of the wiring electrode 30 opposite the side of the organic EL elements 1, and the conducting pattern 40 is formed of a material which has a lower electric resistance than the electric resistance of the end part of the wiring electrode 30. Also such an electric charge emission portion can suppress the concentration of the electric charges in the end part (the end part on the side of the organic EL element 1) opposite the side of the low resistance conducting pattern 40, since the electric charges are attracted to the side of the low resistance conducting pattern 40 when the wiring electrode 30 is charged by static electricity.

At this time, a distance d2 between the end part of the wiring electrode 30 opposite the side of organic EL element 1 and the conducting pattern 40 is defined to be narrower than a distance d1 between the end part of the wiring electrode 30 on the side of the organic EL element 1 and the organic EL element 1 nearest to the end part, whereby the electric charges that are charged in the wiring electrode 30 can be more likely to be moved to the side of the conducting pattern 40, and thus the concentration of the electric charges in the end part (end part on the side of the organic EL element 1) opposite thereto can be more securely suppressed.

Figure 4:
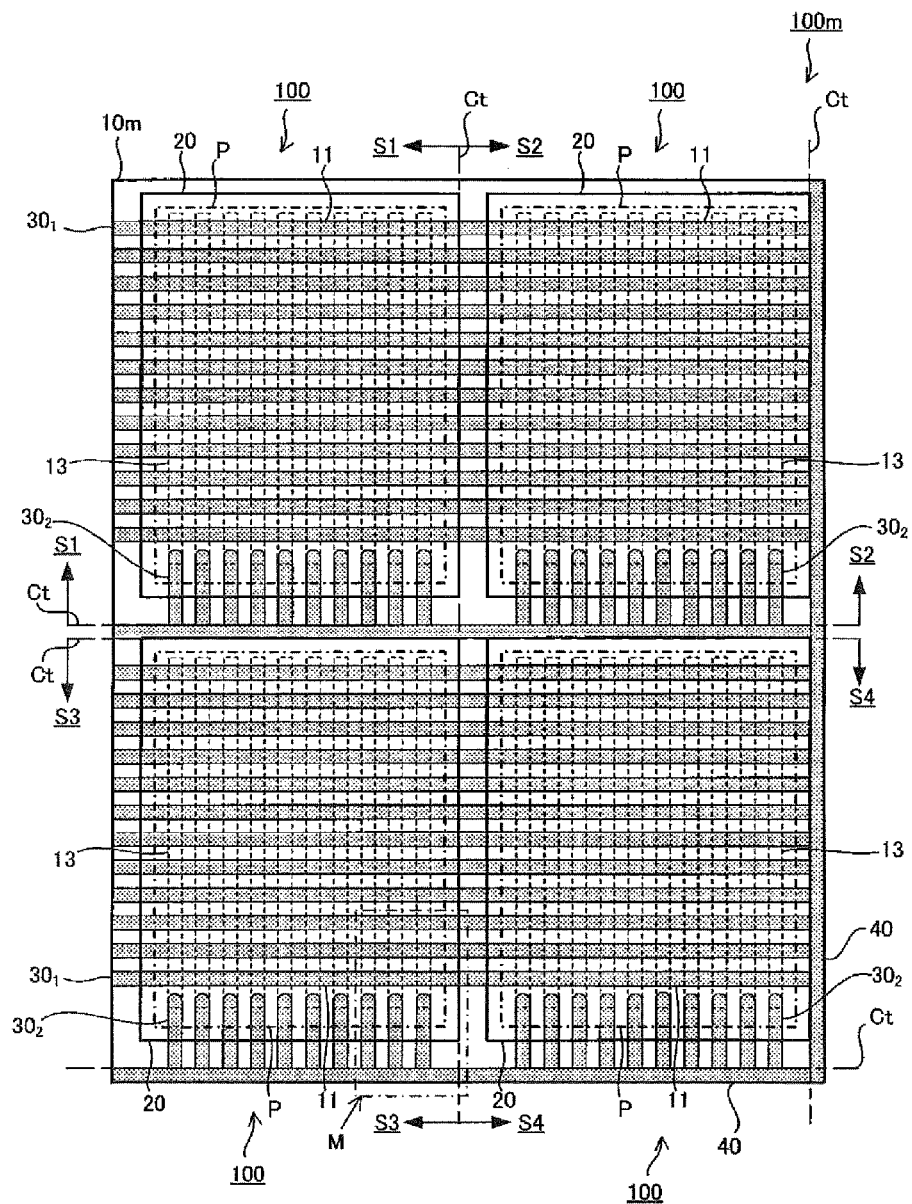
FIG. 4 is a view illustrating the organic EL panel according to another embodiment of the present invention.
Figure 5:
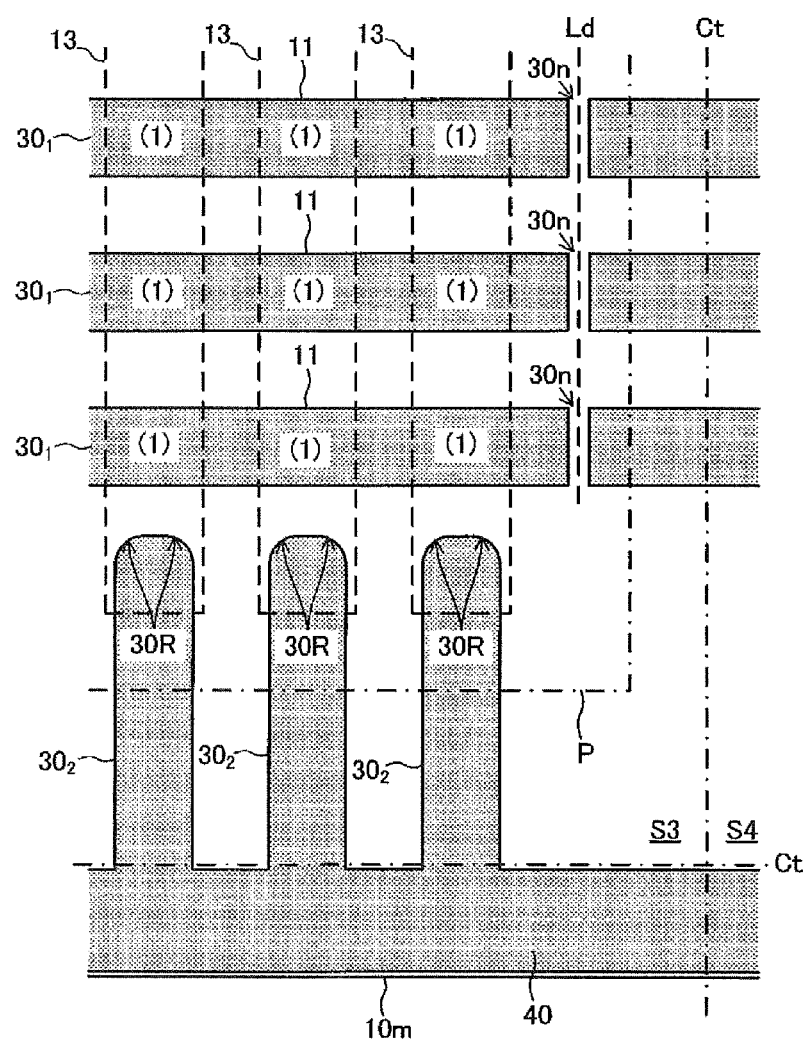
FIG. 5 is a view illustrating the organic EL panel according to another embodiment of the present invention.

FIGS. 4 and 5 are views illustrating the organic EL panel according to another embodiment of the present invention (FIG. 4 is an overall plan view and FIG. 5 is an enlargement view of the M section in FIG. 4). This example makes it possible to obtain individual organic EL panels 100 by segmenting a large panel 100m. A large substrate 10m has a plurality of panel forming regions S1, S2, S3 and S4 by which a plurality of the organic EL panels 100 are formed at the same time.

The large substrate 10m has a first wiring electrode $30_1$, a second wiring electrode $30_2$ and a conducting pattern 40 formed thereon. The first wiring electrode $30_1$ is formed across a plurality of the panel forming regions, and is electrically connected to one of an anode and a cathode of the organic EL element 1. The first wiring electrode $30_1$ is continually formed along with the lower electrode 11 in the example shown in the drawing. The second wiring electrode $30_2$ is formed for each panel forming region, and is electrically connected to the other one of the anode and the cathode of the organic EL element 1. The second wiring electrode $30_2$ is formed so as to have electrical connection to the upper electrode 13 in the example shown in the drawing. The conducting pattern 40 is formed on the large substrate 10m outside the respective panel forming regions S1 to S4 so as to have electrical connection, to the first wiring electrode $30_1$ and the second wiring electrode $30_2$. The conducting pattern 40 is formed in order to emit static electric charges which are charged in the first wiring electrode $30_1$ and the second wiring electrode $30_2$ to the outside of the panel forming regions S1 to S4. The first wiring electrode $30_1$ and the second wiring electrode $30_2$ are electrically connected to the conducting pattern 40 in the example shown in the drawing. However the end parts of the first wiring electrode $30_1$ and the second wiring electrode $30_2$ may be arranged in the proximity of the conducting pattern 40. It is enough only if embodiments are configured such that the electric charges which are charged in the first wiring electrode $30_1$ and the second wiring electrode $30_2$ are more likely to flow into the side of the conducting pattern 40.

The large substrate 10m has sealing substrates 20 applied to the respective panel forming regions S1 to S4 in order to seal the organic EL element 1. A sealing region P is formed on the inner side of the sealing substrate 20. The sealing region P is formed on the inner side of an adhesive layer by joining the large substrate 10m and the sealing substrate 20 via the adhesive layer.

Further, the second wiring electrode $30_2$ has the R shaped portion 30R formed at the end part on the side of the organic EL element 1, and the end part of the second wiring electrode $30_2$ opposite the organic EL element 1 is electrically connected to the conducting pattern 40 or is arranged in the proximity of the conducting pattern 40. Further, the first wiring electrode $30_1$ is segmented at a segmentation position 30n within the sealing region P.

Figure 6:
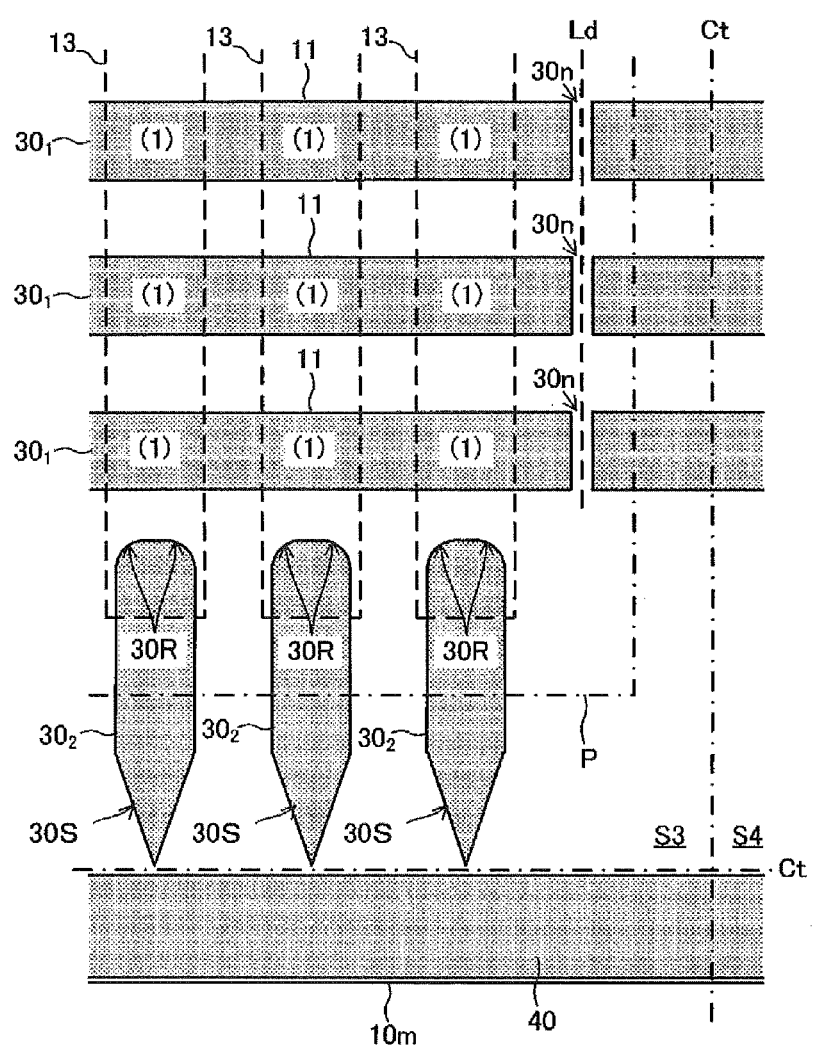
FIG. 6 is a view illustrating the organic EL panel according to another embodiment of the present invention.

FIG. 6 shows a variation of the example shown in FIG. 5. In this example, the end part of the second wiring electrode $30_2$ opposite the organic EL element 1 is sharp shaped to form the electric charge emission portion 30S as shown in FIG. 2(b) and the electric charge emission portion 30S is arranged in the proximity of the conducting pattern 40 for emitting the electric charge. By providing such an electric charge emission portion 30S, the static electric charges which are charged in the second wiring electrode $30_2$ can be more securely kept away from the side of the organic EL element 1.

Next, a method of manufacturing the organic EL panels shown in FIG. 4 to FIG. 6 is described. In a first step, the first wiring electrode $30_1$, the second wiring electrode $30_2$ and the conducting pattern 40 are formed on a large substrate 10m which has a plurality of the panel forming regions S1 to S4 for forming a plurality of the organic EL elements 1. The first wiring electrode $30_1$ is formed across a plurality of panel forming regions, the second wiring electrode $30_2$ is formed for respective panel forming regions S1 to S4, and the conducting pattern 40 for emitting the electric charge is electrically connected to or arranged in the proximity of the first wiring electrode $30_1$ and the second wiring electrode $30_2$.

The first wiring electrode $30_1$, the second wiring electrode $30_2$, and the conducting pattern 40 are pattern formed via photolithography processing after a conduction material was film-formed on the large substrate 10m. The first wiring electrode $30_1$ is continually formed along with the lower electrode 11, and thus after a transparent conductive film (such as ITO) is film-formed a low electrical resistance metal film (such as Al and Ag) is film-formed on the lead wiring portion, which is pattern formed in striped shape. The above-mentioned R shaped portion 30R and the electric charge emission portion 30S of the second wiring electrode $30_2$ are formed concurrently with the stripe shaped pattern and the end part opposite the organic EL element 1 is electrically connected to or arranged in the proximity of the conducting pattern 40. The conducting pattern 40 is formed of low electrical resistance Al or Ag, and is pattern formed at the same time with the first wiring electrode $30_1$ and the second wiring electrode $30_2$.

In a second step, the organic EL element 1 is formed in the respective panel forming regions S1 to S4. The insulating film 14 shown in FIG. 1 or the pattern of the partition wall separating the upper electrode 13 is formed on the lower electrode 11, and an organic layer 12 including a light-emitting layer is film-formed at the opening of a light-emitting part 15 on the lower electrode 11, and further the upper electrode 13 is film-formed. When the upper electrode 13 is film-formed, the upper electrode 13 and the second wiring electrode $30_2$ are connected.

In a third step, a sealing region P is formed for the respective panel forming regions S1 to S4 in order to seal the organic EL element 1. By joining the sealing substrate 20 to the respective panel forming regions S1 to S4 of the large substrate 10m, the sealing region P is formed on the inner side of the adhesive layer which joins the large substrate 10m and the sealing substrate 20.

In a fourth step, the first wiring electrode $30_1$ is segmented for the respective panel forming regions in the sealing region P. As shown in FIG. 5 and FIG. 6, the segmentation position 30n is formed at a portion near the boundary of the panel forming region opposite the lead wire of the first wiring electrode $30_1$ in the sealing region P, and thus the first wiring electrode $30_1$ is formed as an independent wiring. Laser beam is used for the segmentation and the laser beam irradiated via the transparent large substrate 10m and the sealing substrate 20 is moved along a segmentation line Ld, and thus the linearly arranged segmentation positions 30n are formed. As such by segmenting the first wiring electrode $30_1$ within the sealing region P, static electricity can be prevented from entering into the sealing region P from the first wiring electrode $30_1$ which was drawn to the outside of the sealing region P in the portion except for the wiring region. In particular, when condensation occurs on the organic EL panel or even when a conductive object adheres to the wiring region, the present invention effectively solves a problem of a short circuit between wires.

In a fifth step, the large substrate 10m is segmented into respective panel forming regions S1 to S4, and thereby individual organic EL panels 100 are formed. By cutting the large substrate 10m with a cutter along a cutting line Ct, the individual organic EL panels 100 are produced. At this time, the first wiring electrode $30_1$ and the second wiring electrode $30_2$ are cut off from the conducting pattern 40, whereby the lead wire side of the first wiring electrode $30_1$ is cut off along with the large substrate 10m.

Hereinafter, an example of the configuration of the organic EL panel according to an embodiment of the present invention is further specifically described.

The substrate 10 is formed of a base material such as glass, plastic, and metal with a surface covered with a layer of an insulating material, which can support the organic EL element 1. As a transparent electrically conductive layer that forms the lower electrode 11, transparent metal oxide can be used, which includes ITO (Indium Tin Oxide), IZO (Indium Zinc Oxide), zinc oxide series transparent electrically-conductive film, $SnO_2$ series transparent electrically-conductive film, titanium dioxide series transparent electrically-conductive film, and so forth. The lead wiring part of the first wiring electrode $30_1$, the second wiring electrode $30_2$ and the conducting pattern 40 can employ low electric resistance metal such as silver (Ag), silver alloy, aluminum (Al), aluminum alloy and so forth.

The insulating film 14 is provided to ensure the insulation properties of each of the lower electrodes 11, and materials such as polyimide resin, acrylic resin, silicon oxide, and silicon nitride can be used. The insulating film 14 is film-formed on the overall surface of the light-emitting region 100A on the substrate 10 on which the lower electrode 11 is formed, and thereafter a patterning is performed on the lower electrode 11 to form the opening for a light-emitting part 15. Specifically, a film is formed by the spin coating method so as to have a given coating thickness on the element substrate 10 on which the lower electrode 11 is formed and then exposure and development processes are performed using an exposure mask, whereby the layer of the insulating film 14 which has an opening pattern shape for the light-emitting part 15 is formed. The insulating film 14 is formed so as to fill a region between the patterns of the lower electrode 11 while covering a part of the lateral end part of the patterns, and the insulating film 14 is formed in a reticular pattern. As such the opening for the light-emitting part 15 is formed on the lower electrode 11 and the region of the light-emitting part 15 is insulated and segmented by the insulating film 14.

The partition wall (not shown) is formed in striped shape in a direction crossing the lower electrode 11 without the use of a mask and so forth, in order to form the pattern of the upper electrode 13 and to completely electrically insulate the adjoining upper electrodes 13. Specifically, an insulating material such as a light-sensitive resin is applied on the substrate 10 or the insulating film 14 by the spin coating method or the like such that the thickness of the insulating material is greater than the total thickness of the organic layer 12 which forms the organic EL element 1 and the upper electrode 13, thereafter ultraviolet light or the like is radiated onto the light sensitive resin film via a photomask which has a stripe shaped pattern crossing the lower electrode 11, and then a partition wall having a downwardly directed tapered surface is formed by making use of the difference of development rate which is caused by the difference in the amount of exposure in the thickness direction of a layer.

The organic layer 12 has a laminating structure of light-emitting function layers comprising a light-emitting layer 12A, and if either one of the lower electrode 11 and the upper electrode 13 is defined as an anode and the other one is defined as a cathode, then a hole injecting layer, a hole transport layer, a light-emitting layer, an electron transport layer, electron injection layer and so forth are selectively formed sequentially from the anode side. The vacuum deposition method and so forth are used as a dry deposition film-forming for the organic layer 12, and coating and various types of printing methods are used as a wet deposition film-forming.

Hereinafter, a forming example of the organic layer 12 is described. For example, first, NPB (N,N-di(naphtalene)-N, N-dipheneyl-benzidene) is film-formed as the hole transport layer. The hole transport layer has a function of transporting a positive hole which is injected from an anode to a light-emitting layer. The hole transport layer may be formed as either a single layer lamination or multiple layer lamination. Further, the hole transport layer may have a single layer formed by a plurality of materials instead of a single material, and a host material which has a high charge transfer capacity may be doped with a guest material which has a high electron donating (accepting) capacity.

Next, a light-emitting layer is film-formed on the hole transport layer. As an example, a red (R), a green (G), and a blue (B) light-emitting layers are film-formed on the respective film-forming regions by means of a color painting mask in accordance with a deposition method of resistance heating. As the red (R) color, an organic material which emits a red color of styryl dye and so forth such as DCM1 (4-dicyanomethylene-2-methyl-6-(4'-dimethylaminostyryl)-4H-pyran) is used. As the green (G) color, an organic material which emits a green color of aluminato-tris-8-hydroxyquinolate ($Alq_3$) and so forth is used. As the blue (B) color, an organic material which emits a blue color of distyryl derivative, triazole derivative and so forth is used. Of course, other materials may be used or host-guest system layers may be configured. Further, the light-emitting may be performed by using a fluorescent light emitting material or a phosphorescent light emitting material.

The electron transport layer film-formed on the light-emitting layer is film-formed by various types of film-forming methods including the resistance heating deposition method, by using various types of materials, for example, such as aluminato-tris-8-hydroxyquinolate ($Alq_3$). The electron transport layer has a function of transporting an electron injected from the cathode to the light-emitting layer. The electron transport layer may be formed as a single layer lamination or have a multilayer structure formed as a multiple layer lamination. Further, the electron transport layer may have a single layer formed by a plurality of materials instead of a single material, or may be formed such that a host material which has a high charge transfer capacity is doped with a guest material which has a high electron donating (accepting) capacity.

If the upper electrode 13 formed on the organic layer 12 is defined as a cathode, it can be made of materials (metal, metal oxide, metallic fluoride, alloy and so forth) which have smaller work function than an anode (for example, 4 eV or less), and specifically, an metallic film such as aluminum (Al), indium (In), and magnesium (Mg), a non-crystalline semiconductor such as doped polyaniline and doped polyphenylene vinylene, and oxidized materials such as $Cr_2O_3$, NiO, $Mn_2O_3$ may be used. A single layer structure using a metal material, a laminated layer structure using $LiO_2$ and so forth can be adopted as the structure.

The sealing substrate 20 may use a plate-like member or a container shaped member made of metal, glass, plastic and so forth. As an example, the glass made sealing substrate 20 having a sealing recessed portion formed (either by one-step graving or by two-step graving) via a processing such as press forming, etching and blasting may be used, or the sealing region P may be formed with a spacer made of glass (plastic can also be used) between the substrate 10 and the sealing substrate 20.

As an adhesive agent for joining the sealing substrate 20 to the substrate 10, thermosetting adhesive, chemically curing adhesive (two liquid mixed), light (ultraviolet rays) curable adhesive and so forth can be used. As a material of the adhesive agent acryl resin, epoxy resin, polyester, polyolefin and so forth can be used. In particular, an ultraviolet-ray curable type adhesive agent made of epoxy resin which is fast curable without heating process is preferably used.

According to the organic EL panel and the method of manufacturing the same having a feature described above, it is possible to prevent the static electricity which was charged in the wiring electrode 30 ($30_1$, $30_2$) pattern formed on the substrate 10 at the stage of manufacturing the organic EL panel 100 from having an adverse effect on the organic layer 12 and the element structure of the organic EL element 1. Even if a removal of electricity cannot be completely performed when the wiring electrode 30 is charged by static electricity, by forming the R shaped portion 30R at the end part of the wiring electrode 30 ($30_1$, $30_2$) the electric charge accumulated in the wiring electrode 30 is prevented from concentrating at the end part on the side of the organic EL element 1, whereby the electric charge is prevented from flowing into the organic EL element 1.

Although the embodiments of the present invention have been described in detail with reference to the drawings, the specific configurations are not limited to these embodiments, and any design alterations which are made without departing from the scope of the invention, can be included in the present invention. Embodiments shown in each of the above drawings can be combined by mutually using each technique unless there is a specific contradiction or a problem in terms of the purpose, configuration and so forth. Further, the descriptive content of each drawing can be a separately independent embodiment, and thus the embodiment of the present invention should not be limited to one embodiment constituted by combining respective drawings.

The invention claimed is:

1. An organic EL panel forming at least one organic EL element on a substrate, wherein
    said organic EL element has a laminating structure in which an organic layer including a light-emitting layer is arranged between an anode and a cathode,
    a light-emitting region in which said organic EL element is formed and a wiring region in which a wiring electrode is formed on said substrate,
    said wiring electrode is electrically connected to the anode or the cathode of said organic EL element, and
    said wiring electrode has a planar shaped portion having a rounded corner at the end part on the side of said organic EL element, and
    wherein the planar shaped portion of the wiring electrode is disposed between said substrate and one of said anode or said cathode.

2. The organic EL panel according to claim 1, wherein an electric charge emitting portion for emitting the electric charge that has been charged in said wiring electrode is formed at the end part of said wiring electrode opposite the side of said organic EL element.

3. The organic EL panel according to claim 2, wherein said electric charge emitting portion is formed at the end part of said wiring electrode and the planar shape of said end part is sharp shaped directed to the end edge side of said substrate.

4. The organic EL panel according to claim 2, wherein said electric charge emitting portion is formed with a conducting pattern which is formed in the proximity of the end part of said wiring electrode opposite the side of said organic EL element, and the conducting pattern is formed of a material having electrical resistance lower than the electrical resistance of the end part of said wiring electrode.

5. The organic EL panel according to claim 4, wherein the distance between the end part opposite the side of said organic EL element and said conducting pattern is narrower than the distance between the end part of said wiring electrode on the side of said organic EL element and said organic EL element nearest to the end part.

6. The organic EL panel according to claim 1, wherein
a sealing region for sealing said light-emitting region is formed,
a wiring electrode is provided to extend from said sealing region to the end part of said substrate except for said wiring region, and
said wiring electrode is divided within said sealing region.

7. The organic EL panel according to claim 2, wherein
a sealing region for sealing said light-emitting region is formed,
a wiring electrode is provided to extend from said sealing region to the end part of said substrate except for said wiring region, and
said wiring electrode is divided within said sealing region.

8. The organic EL panel according to claim 3, wherein
a sealing region for sealing said light-emitting region is formed,
a wiring electrode is provided to extend from said sealing region to the end part of said substrate except for said wiring region, and
said wiring electrode is divided within said sealing region.

9. The organic EL panel according to claim 4, wherein
a sealing region for sealing said light-emitting region is formed,
a wiring electrode is provided to extend from said sealing region to the end part of said substrate except for said wiring region, and
said wiring electrode is divided within said sealing region.

10. The organic EL panel according to claim 5, wherein
a sealing region for sealing said light-emitting region is formed,
a wiring electrode is provided to extend from said sealing region to the end part of said substrate except for said wiring region, and
said wiring electrode is divided within said sealing region.

11. An organic EL panel comprising:
at least one organic EL element formed on a substrate, the at least one organic EL element comprising a laminated structure comprising an organic layer including a light-emitting layer arranged between an anode and a cathode;
a light-emitting region in which said organic EL element is formed, and
a wiring region in which at least one wiring electrode is disposed between said substrate and one of said anode or said cathode,
wherein said at least one wiring electrode comprises a planar portion having a rounded corner formed at an end part of said at least one second wiring electrode closest to said organic EL element,
wherein the rounded corner of the wiring electrode is disposed between the substrate and one of the anode or the cathode.

12. An organic EL panel, comprising:
a light-emitting region comprising an organic EL element formed on a substrate, said organic EL element having a laminating structure and comprising:
a lower electrode comprising one of an anode and a cathode;
an upper electrode comprising the other one of the anode and the cathode; and
an organic layer including a light-emitting layer arranged between the lower electrode and the upper electrode; and
a wiring region in which a wiring electrode is formed on said substrate,
wherein said wiring electrode extends from said light-emitting region, the upper electrode of said organic EL element being formed on and electrically connected to the wiring electrode, and
wherein said wiring electrode comprises a rounded corner at an end part of the wiring electrode on the side of said organic EL element, and
wherein the rounded corner of the wiring electrode is disposed between the substrate and one of the anode or the cathode.

13. An organic electroluminescent (EL) panel, comprising:
an organic EL element formed on a substrate and comprising:
an anode;
a light-emitting layer formed on the anode;
a cathode formed on the light-emitting layer; and
a wiring electrode formed on the substrate adjacent to the organic EL element,
the cathode of the organic EL element being formed on and electrically connected to the wiring electrode,
wherein the wiring electrode includes a first end part formed adjacent to the organic EL element and including a rounded corner, and
wherein the rounded corner of the wiring electrode is disposed between the substrate and one of the anode or the cathode.

* * * * *